United States Patent [19]

Chapple-Sokol et al.

[11] Patent Number: 5,612,255
[45] Date of Patent: Mar. 18, 1997

[54] ONE DIMENSIONAL SILICON QUANTUM WIRE DEVICES AND THE METHOD OF MANUFACTURE THEREOF

[75] Inventors: Jonathan D. Chapple-Sokol, Poughkeepsie; Seshadri Subbanna, Hopewell Junction; Manu J. Tejwani, Yorktown Heights, all of N.Y.

[73] Assignee: International Business Machines Corporation, Armonk, N.Y.

[21] Appl. No.: 466,315

[22] Filed: Jun. 6, 1995

Related U.S. Application Data

[63] Continuation of Ser. No. 171,287, Dec. 21, 1993, abandoned.

[51] Int. Cl.$^6$ .................... H01L 21/265; H01L 21/44; H01L 21/48
[52] U.S. Cl. ............................. 437/203; 437/40
[58] Field of Search ................ 437/203, 40 R

[56] References Cited

U.S. PATENT DOCUMENTS

| | | | |
|---|---|---|---|
| 4,460,413 | 7/1984 | Hirata et al. | 148/1.5 |
| 4,502,914 | 3/1985 | Trumpp et al. | 156/643 |
| 4,510,016 | 4/1985 | Chi et al. | 156/643 |
| 4,666,554 | 5/1987 | De Wilde et al. | 156/643 |
| 4,748,132 | 5/1988 | Fukuzawa et al. | 437/25 |
| 4,784,718 | 11/1988 | Mitani et al. | 156/643 |
| 4,803,181 | 2/1989 | Buchmann et al. | 437/228 |
| 4,838,991 | 6/1989 | Cote et al. | 156/643 |
| 4,859,622 | 8/1989 | Eguchi | 437/47 |
| 4,931,137 | 6/1990 | Sibuet | 156/656 |
| 4,979,014 | 12/1990 | Hieda et al. | 357/56 |
| 5,093,273 | 3/1992 | Okumura | 437/40 |
| 5,110,760 | 5/1992 | Hsu | 437/180 |
| 5,144,580 | 9/1992 | Niu et al. | 365/149 |
| 5,202,272 | 4/1993 | Hsieh et al. | 437/40 |
| 5,204,280 | 4/1993 | Dhong et al. | 437/52 |
| 5,244,828 | 9/1993 | Okada et al. | 437/81 |
| 5,256,248 | 10/1993 | Jun | 156/653 |
| 5,256,587 | 10/1993 | Jun et al. | 437/52 |
| 5,281,543 | 1/1994 | Fukuzawa | 437/29 |
| 5,293,037 | 3/1994 | LeMehaute et al. | 250/214.1 |
| 5,296,719 | 3/1994 | Hirai et al. | 257/14 |
| 5,346,834 | 9/1994 | Hisamoto et al. | 437/41 |
| 5,350,337 | 9/1994 | Yamazaki et al. | 257/316 |
| 5,391,506 | 2/1995 | Tada et al. | 437/41 |

FOREIGN PATENT DOCUMENTS

| | | |
|---|---|---|
| 2-114631 | 10/1988 | Japan. |
| 1-276669 | 11/1989 | Japan. |
| 2-125666 | 5/1990 | Japan. |

OTHER PUBLICATIONS

Fujii, M., et al. "Quantum Dots of Ge Embedded in SiO$_2$ Thin Films: Optical Properties" 20th Int'l Conf. on the Physics of Semiconductors, V.3, p. 2375–2378, 1990.

*Primary Examiner*—Mary Wilczewski
*Assistant Examiner*—Brian K. Dutton
*Attorney, Agent, or Firm*—Charles W. Peterson, Jr.

[57] ABSTRACT

A silicon quantum wire transistor. A silicon substrate is sub-etched leaving a thin ridge ($\leq 500$ Å tall by $\leq 500$ Å wide) of silicon a quantum wire, on the substrate surface. An FET may be formed from the quantum wire by depositing or growing gate oxide and depositing gate poly. After defining a gate, the source and drain are defined. Alternatively, an optically activated transistor is formed by defining an emitter and collector and providing a path for illumination to the wire.

13 Claims, 4 Drawing Sheets

ONE DIMENSIONAL SILICON QUANTUM WIRE DEVICES AND THE METHOD OF MANUFACTURE THEREOF

The application is a continuation of application Ser. No. 08/171,287, filed Dec. 21, 1993 now abandoned.

FIELD OF THE INVENTION

The present invention relates to semiconductor devices and more particularly to silicon transistors.

BACKGROUND OF THE INVENTION

Bipolar transistors are known. Field Effect Transistors (FETs) are known. It is desirable to make each of these types of semiconductor devices as small as possible without losing either the device's current carrying capabilities or the current/voltage gain that is characteristic to each device type. FET current ($I_d$) is proportional to device width (W), so to increase current, FET's are widened. Unfortunately, device capacitances and especially gate capacitance ($C_g$) is also proportional to W. Consequently, increasing prior art FET current capacity also meant accepting larger gate capacitance and as a result, larger loads. It also meant device area grew instead of shrunk.

Optically switched transistors are also known. An Optoisolator, for example, is, basically, a Light Emitting Diode (LED) in close proximity to an optically switched transistor. The LED emits light that turns on the optically switched transistor, switching it from off to on. Optical receivers provide a significant performance advantage over typical voltage signal receivers. Optical receivers also provide a simple solution to the problems associated with interfacing to long-distance optical transmission signals, and to incompatible logic families and signal levels. The performance advantage results because optical signals, generally, do not suffer from the transmission line effects (overshoot, undershoot, ringing, etc.) normally associated with electrical signals. Ringing on a signal forces the receiver to have built-in insensitivity to ringing or to wait until ringing subsides sufficiently. Either way, ringing delays signal recognition. A delay that is avoided with an optically switched receiver.

Similar to the overshoot and undershoot problem is that of interfacing incompatible logic families/signals, e.g., interfacing a low voltage CMOS receiver (with 2.5–3.5 V power supply levels) to a telephone line with potential voltage swings in excess of 20 V. Direct connection could destroy the CMOS receiver circuit. So, an appreciable amount of interface circuitry is required to connect these two incompatible circuits. Unfortunately, it has not been possible to imbed optical receivers into silicon integrated circuit chips.

Prior art optical transistors have been implemented in Group III–V semiconductor technology, primarily in GaAs, but not in Group IV semiconductor materials, and in particular, not in silicon based technology. See, for example, "Quantum Dots of Ge Embedded in SiO₂ Thin Films: Optical Properties," by M. Fugii, S. Hayashi and K. Yamamoto, 20th International Conference on the Physics of Semiconductors, Vol. 3, pp. 2375–2378 (1990) which discusses luminescence from microcrystallites of Ge embedded in $SiO_2$, indicating the existence of zero dimensional quantum dots. However, these dots are not connected electrically and are, therefore, not usable for devices.

Quantum wires are known for Group III–V materials and used for fabricating semiconductor lasers, See, for example, U.S. Pat. No. 4,748,132 "Micro Fabrication Process for Semiconductor Structure using Coherent Electron Beams," to Fukuzawa et al., incorporated herein by reference. Quantum wires are semiconductor wires so thin as to enable exploitation of the quantum size effect on carriers.

OBJECTS OF THE INVENTION

It is a purpose of the present invention to reduce semiconductor device size.

It is another purpose of the present invention to eliminate FET width effects.

It is yet another purpose of the present invention to improve silicon integrated circuit isolation.

It is yet another purpose of the present invention to couple optical signals directly to a silicon integrated circuit chip.

It is yet another object of this invention to minimize transmission line effects on high performance silicon integrated circuit chips.

SUMMARY OF THE INVENTION

A method of forming a device in a semiconductor substrate, the method comprising etching a surface of the semiconductor substrate to form a quantum wire; growing oxide over the wire; and providing an activation source to the wire. In one embodiment, the activation source is a polysilicon gate. In a second embodiment, the activation source is an infra-red light source.

DESCRIPTION OF THE PREFERRED EMBODIMENTS

The present invention is a silicon quantum well transistor. In one preferred embodiment, the transistor is an FET, activated by a voltage supplied to its gate. In a second preferred embodiment, the transistor is an optically activated bipolar transistor, activated by light at its base.

Figure 1A:
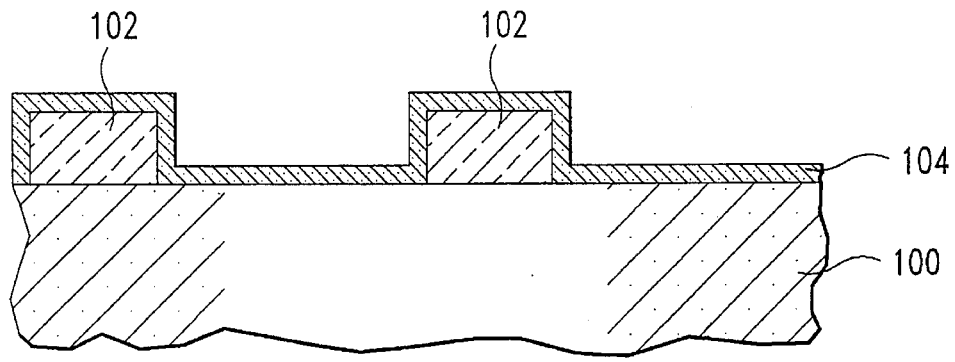
FIGS. 1A–1D represent the steps in forming silicon quantum wires for the preferred embodiment transistors.
Figure 1B:
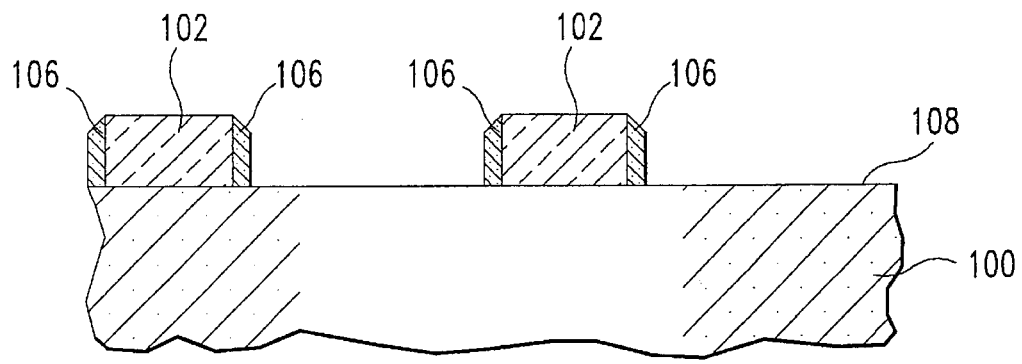
Figure 1C:
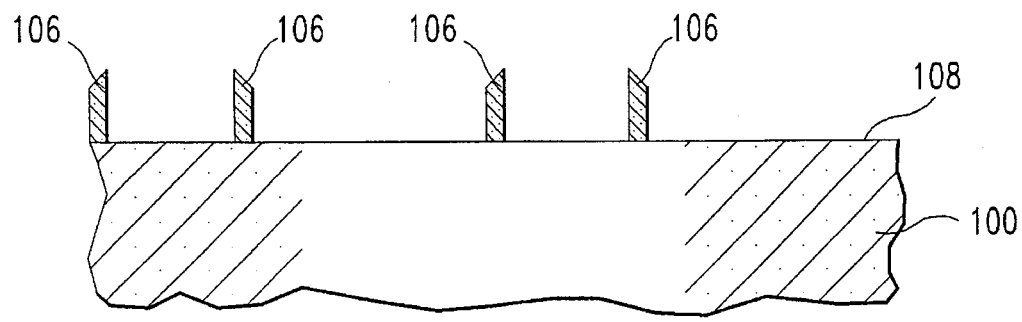
Figure 1D:
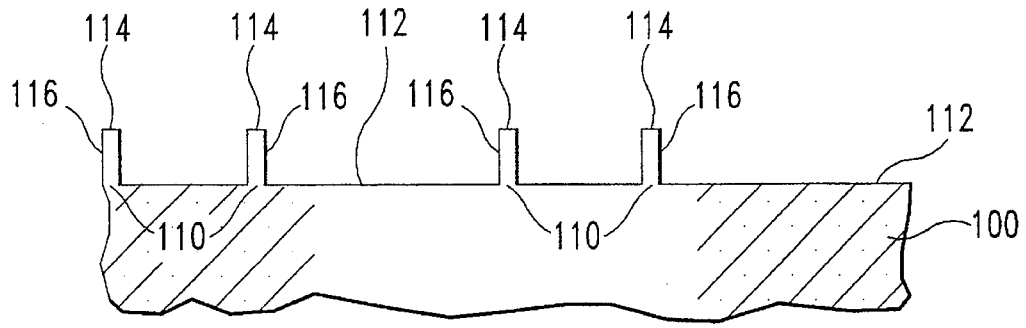

FIGS. 1A–D show the steps in preparing silicon quantum wires for the preferred embodiment transistors. First, quantum wires are defined on the Si substrate 100 of FIG. 1A. 500 Å oxide pads 102 are formed on the substrate 100. A layer of polysilicon 104 (poly) is formed on the substrate 100, covering the oxide pads 102. In FIG. 1B, the poly is Reactive Ion Etched (RIE) to remove horizontal poly, leaving poly sidewalls 106 alongside each oxide pad 102. Next, in FIG. 1C, the oxide pads are removed, leaving the poly sidewalls 106 standing on the substrate surface 108. Finally, the substrate surface 108 is recessed in FIG. 1D, using the sidewalls 106 as a mask. The substrate surface 108 and poly sidewalls 106 are RIE'ed, until the substrate surface 108 is removed from between the sidewalls 106 as the poly sidewalls 106 are removed. The poly sidewalls 106 protect the substrate surface 108 immediately under them from damage which would otherwise occur. Ridges 110 are left where the poly sidewalls 106 stood. These ridges are the quantum wires 110 formed on the new substrate surface 112. Because the ridges' top 114 was protected by the poly sidewalls, and because there is a polymer residue passivation of the ridges' sides 116 during RIE, the crystal quality in the ridge is maintained, i.e. remains high. These ridges must be thin enough that carriers moving in them can move in one direction only, along the length of the wire. Therefore, the quantum wires 110 are thinner than the carriers' characteristic scattering length. Preferably, the quantum wires are ≦500 Å tall and ≦500 Å wide. Thus carriers in the quantum wires 110 have very high mobility. High mobility carriers in the quantum wires 110 move along the wire length very quickly compared to normal drift current carriers. There are two preferred embodiment QWFETs. In one embodiment, the quantum wires are formed on prior art FET channels to supplement the prior art FET. In a second embodiment, the quantum wire alone forms the FET channel.

If the FET is depletion mode, carriers are ion implanted into the wire to shift the depletion FET's $V_T$ past zero (negative or positive for n-type or p-type FETs, respectively). Depletion ion implantation, if done, is done at any step prior to forming the FET's gate. Preferably, depletion ion implantation is done after the quantum wires 110 are formed.

Figure 2A:
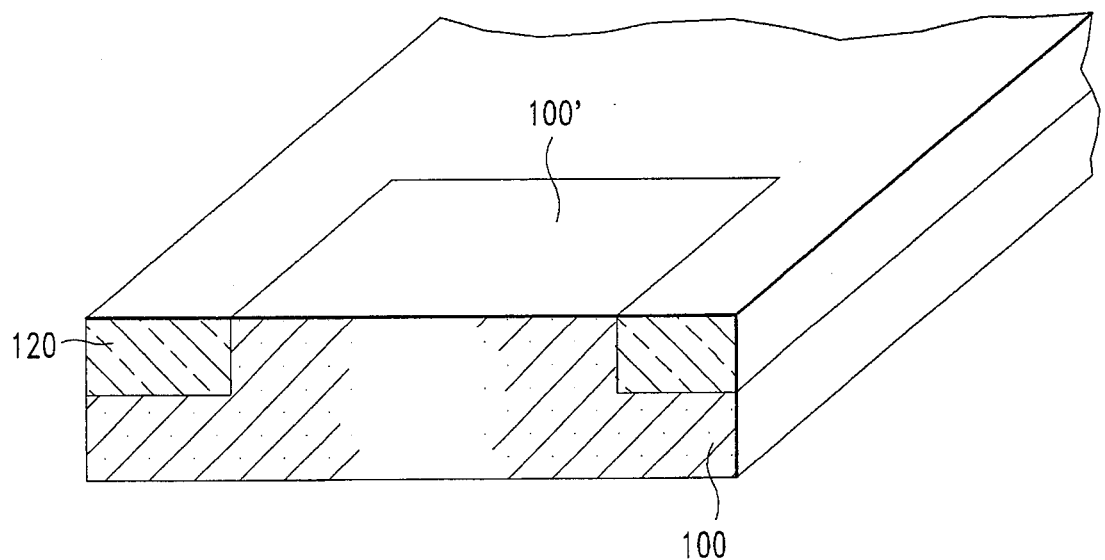
FIGS. 2A–E represents a plan view of the first preferred embodiment Quantum Wire FET according to the present invention.
Figure 2B:
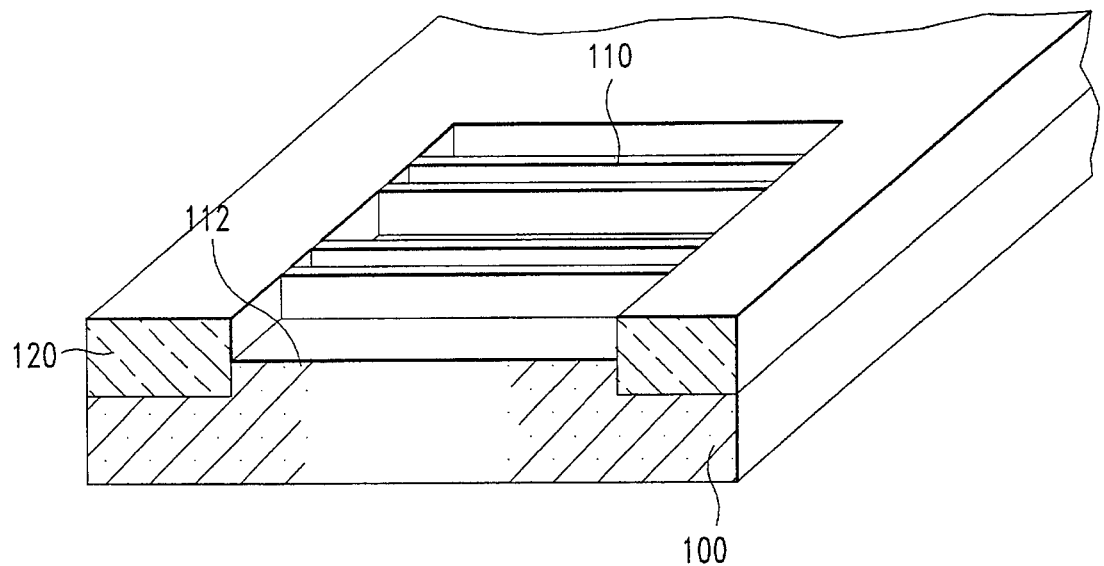
Figure 2C:
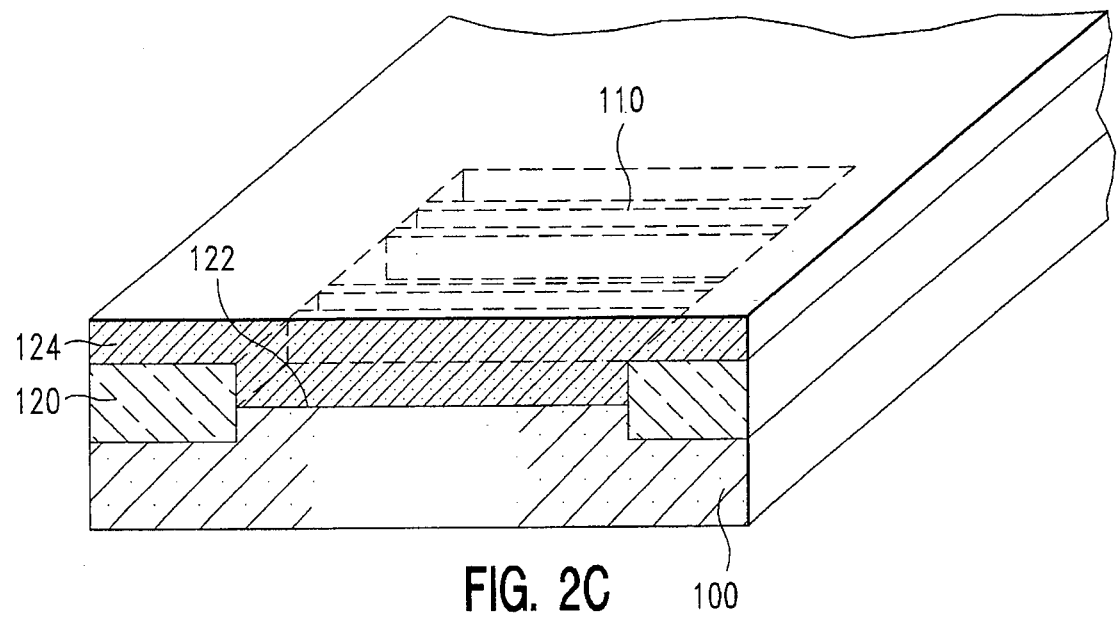
Figure 2D:
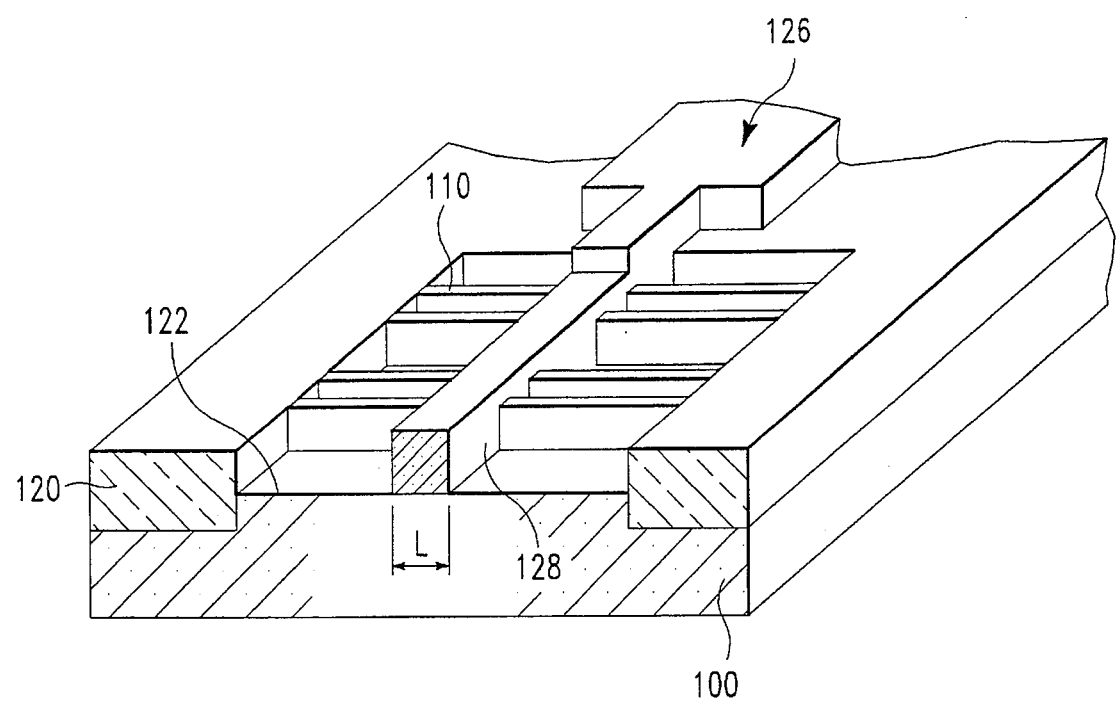
Figure 2E:
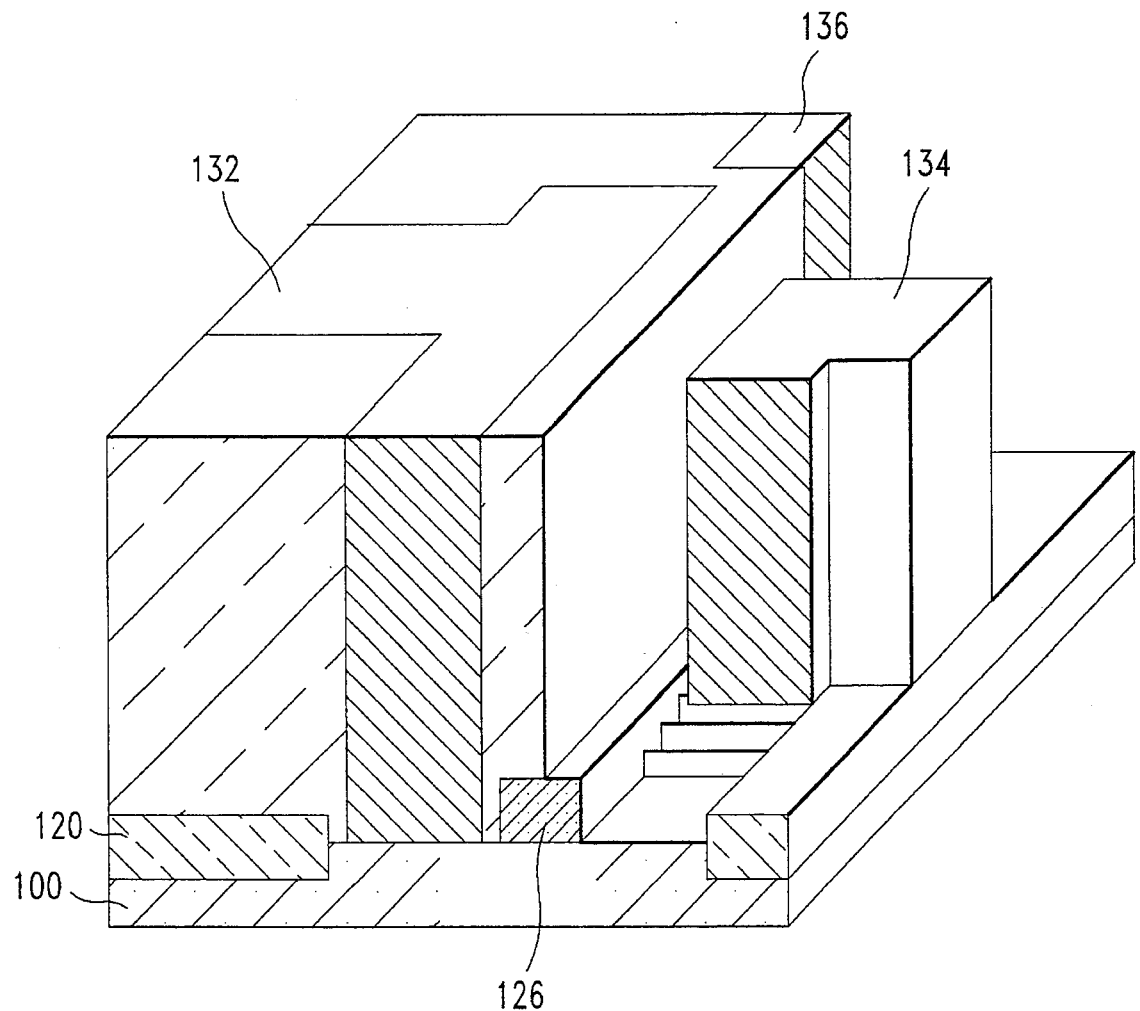

FIGS. 2A–E respresent the steps in forming an FET from quantum wires as formed in FIGS. 1A–D. First, in FIG. 2A, device region 100' is defined in substrate 100 by forming thick field oxide 120. In FIG. 2B, quantum wires 110 are formed in device region 100' as described above and depicted in FIGS. 1A–D. In the FET embodiment, as shown in FIG. 2C, a thin gate oxide layer 122, 40 Å to 120 Å thick, preferably 50 Å, is grown on substrate surface. A 1000–2000 Å thick layer of polysilicon 124 is deposited on the thin gate oxide layer 122. The gate is formed from this polysilicon layer 124. A parasitic FET forms wherever the poly layer 124 remains over thin oxide 120. The parasitic FET (a prior art FET) has the same $V_T$ as the Quantum Wire FET (QWFET), preferably 0.5 V. To achieve this threshold, the Si substrate 100 is doped to $2\times10^{17}/cm^3$. Isolation between QWFETs is done as with prior art FETs, using thick field oxide. Alternatively, after depositing gate oxide, the QWFETs may be isolated from each other by forming a layer of insulator (such as oxide) between the quantum wires. In FIG. 2D after depositing the polysilicon layer 124, the QWFET gate is photolithographically defined and the poly layer 124 is etched back, leaving gate 126. Having thus defined the QWFET 128, FIG. 2E represents the final structure after proceeding with the remaining fabrication steps, i.e. source, drain definition and diffusion, and source 132, drain 134, and gate 136 contacts, (to subsequent layers) as in prior art FET's.

The present invention QWFET can be used as would any prior art FET. As noted above, applying a voltage to an enhancement QWFET's gate excites carriers in the quantum wire channel sufficiently to force the carriers out of the quantum well, causing current to flow, closing the QWFET switch. Removing the gate voltage ($V_G$) opens the switch, allowing carriers in the channel to return to their respective quantum well, stopping current flow.

Since the quantum wire is the width, Z, of the carrier's quantum well, it, effectively, is a one-dimensional (length) structure and the QWFET is a one-dimensional device. As a result of this one-dimensional characteristic, carrier mobility $\mu_n$ in the quantum wire is more than twice that of prior art FETs at room temperature and more than tenfold as operating temperature approaches absolute zero at 20°–30° K. Drain saturation current, $I_{Dsat}$, is dependent upon $V_G$, intrinsic channel capacitance $C_i$ and channel length L and is determined by:

$$I_{Dsat} = \frac{mZ}{L} \mu_n C_i (V_G - V_T)^2,$$

where m is a constant. Furthermore, since delay is the product of load $C_w$ and channel transconductance, $$G_m = \frac{\Delta I_{Dsat}}{\Delta V_G},$$

delays are reduced. Because $G_m$ increases by at least 2x, circuit delays ($C_w/G_m$) are half of the normally expected delay. Current, instead of increasing for a wider QWFET as in prior art FET's, decreases when the QWFET ceases to exist because of widening channel. Furthermore, by making the channel narrow (as narrow as the carrier's quantum well), makes FET current higher for the QWFET instead of lower as would have been expected for prior art FETs. Device width, which is fixed, is not an obstacle to shrinking circuit size when using the QWFET of the present invention. Also, performance improves for smaller circuits because the shorter the QWFET channel, the higher the QWFET current, the lower the gate-channel capacitance and, consequently, the smaller the loads $C_w$. Smaller loads and higher current results in shorter delays and even better performance.

Thus, merely by replacing prior art FETs with QWFETs a significant size, performance and power gain is realized (all primary objectives of nearly every FET circuit or chip designer). QWFETs provide a significant advantage over prior art FETs.

In the second preferred embodiment of the present invention, a Quantum Wire bipolar Transistor (QWT), quantum wires are formed in silicon as in FIGS. 1A–1D, but the steps of FIG. 2C of forming gate oxide and a gate are omitted. Instead, a source of infra-red light is provided to the length of the quantum wire that would have been the QWFET's channel, the QWT's base. The QWT's emitter and collector are in the quantum wire at opposite ends of the base. The base is light activated by infrared photons with an energy level of 50–100 meV. As with applying voltage to the QWFET's gate, applying this level of infrared to the QWT's base excites carriers in the quantum wire base sufficiently to force the carriers out of the quantum well, causing current to flow between the collector and emitter i.e., turning on the QWT. This second preferred embodiment transistor can be used in place of any prior art optically switched transistor. Further, because it is a silicon transistor, the QWT can be integrated into any silicon Integrated Circuit (IC) family such as CMOS, BiCMOS, or used in any QWFET circuit or chip. Thus, QWTs allow silicon chips to be optically isolated very simply.

While the present invention is described in terms of preferred embodiments, numerous modifications and variations will occur to a person of ordinary skill in the art without departing from the spirit and scope of the present invention. It is intended that those modifications and variations fall within the scope of the appended claims.

We claim:

1. A method of forming a transistor in a silicon substrate, said method comprising the steps of:
   a) forming a plurality of device regions in a surface of said silicon substrate;
   b) sub-etching away said surface of said silicon substrate to form a sub-etched surface in said plurality of device regions, sub-etching the surface comprising the steps of:

1) depositing a plurality of oxide pads on said surface, 2) forming a polysilicon layer on said plurality of oxide pads along the sides of said pads and on said substrate, 3) Reactive Ion Etching said polysilicon layer from said pads and said surface, whereby sidewalls of polysilicon remain along the sides of at least one of said plurality oxide pads, 4) removing said plurality of oxide pads, and, 5) Reactive ion etching to remove said sidewalls and said silicon surface simultaneously, such that a plurality of ridges remain above the sub-etched surface beneath each said sidewall, each of said plurality of ridges being ≦500 Å tall and ≦500 Å wide and being a quantum wire; and, c) forming at least 2 conductive regions in each said quantum wire, said at least 2 conductive regions being conduction regions of said transistor, whereby when said transistor is conducting current and the length of said quantum wire between said conduction regions is the primary current path for said current through said transistor.

2. The method of claim 1 further comprising:

d) forming a FET gate on at least one said quantum wire, said FET gate formed by the steps of:

1) forming a gate oxide layer over said quantum wire and said surface; and 2) forming said FET gate on said gate oxide over said at least one quantum wire.

3. The method of claim 1 wherein the step (c) of forming at least 2 conductive regions forms a transistor, and comprises the steps of:

1) forming a gate oxide layer over each said quantum wire and said surface; and 2) forming a gate on said gate oxide over each said quantum wire, said gate being formed between said at least 2 conductive regions.

4. A method of forming a transistor in a silicon substrate, said method comprising the steps of:

a) forming a device region in a surface of said silicon substrate;

b) forming at least one polysilicon line on said device region;

c) simultaneously sub-etching said at least one polysilicon line and the surface of the substrate in said device region until said at least one polysilicon line is etched away to form a sub-etched surface, each said at least one polysilicon line masking said surface such that a ridge is formed therebeneath, said ridge extending above the sub-etched surface, each said ridge forming a quantum wire; and, d) forming a conduction region at each end of each said quantum wire.

5. The method of claim 4 wherein each said ridge is ≦500 Å tall and ≦500 Å wide.

6. The method of claim 4 wherein the step (b) of forming at least one polysilicon line comprises the steps of:

1) forming an oxide pad on said surface;

2) depositing a polysilicon layer on said surface, said polysilicon layer covering said oxide pad;

3) etching said polysilicon layer such that polysilicon sidewalls remain alongside said oxide pad; and 4) removing said oxide pad.

7. The method of claim 6 wherein a source is a conduction region at one wire end and a drain is a conduction region at an opposite wire end.

8. The method of claim 7 wherein the step (d) of forming said source and said drain includes implanting a dopant in said quantum wire such that an FET formed in said quantum wire is a depletion mode FET.

9. The method of claim 7 further including before the conduction region forming step (d) the step of:

c1) forming a gate over at least one said quantum wire.

10. The method of claim 9 wherein the step (c1) of forming the gate comprises the steps of:

1) forming a gate oxide layer over each said quantum wire;

2) depositing a polysilicon gate layer on said gate oxide layer; and, 3) selectively removing said polysilicon gate layer to define said gate.

11. The method of claim 10 wherein the device region is defined by forming field oxide.

12. The method of claim 11 wherein at least one gate is formed over at least two quantum wires and a parasitic FET is formed between said at least two quantum wires.

13. The method of claim 6 wherein a collector is formed by a conduction region at one quantum wire end and an emitter is formed by a conduction region at an opposite end.

* * * * *